(12) United States Patent
Osten

(10) Patent No.: US 7,129,551 B2
(45) Date of Patent: Oct. 31, 2006

(54) ELECTRONIC COMPONENT HAVING A PRASEODYMIUM OXIDE LAYER AND PROCESS FOR FABRICATING SAME

(75) Inventor: Hans-Joerg Osten, Muellrose (DE)

(73) Assignee: IHP GmbH-Innovations for High Performance Electronics (DE)

( * ) Notice: Subject to any disclaimer, the term of this patent is extended or adjusted under 35 U.S.C. 154(b) by 68 days.

(21) Appl. No.: 10/343,494

(22) PCT Filed: Jul. 31, 2001

(86) PCT No.: PCT/EP01/08830

§ 371 (c)(1),
(2), (4) Date: Jun. 5, 2003

(87) PCT Pub. No.: WO02/13275

PCT Pub. Date: Feb. 14, 2002

(65) Prior Publication Data

US 2003/0193061 A1    Oct. 16, 2003

(51) Int. Cl.
*H01L 31/062* (2006.01)

(52) U.S. Cl. .............. 257/410; 257/288; 257/213; 438/142; 438/197; 438/199; 438/216

(58) Field of Classification Search ............ 257/410, 257/296, 411, 412, 413; 438/216, 261, 421, 438/591, 287, 575, 981, 754
See application file for complete search history.

(56) References Cited

U.S. PATENT DOCUMENTS

| | | | |
|---|---|---|---|
| 5,514,904 A * | 5/1996 | Onga et al. | |
| 5,810,923 A | 9/1998 | Yano | |
| 5,828,080 A | 10/1998 | Yano | |
| 5,955,213 A | 9/1999 | Yano | |
| 6,013,553 A | 1/2000 | Wallace | |
| 6,045,626 A * | 4/2000 | Yano et al. | |
| 6,087,702 A | 7/2000 | Chang | |
| 6,469,357 B1 * | 10/2002 | Hong et al. | |
| 6,656,852 B1 | 12/2003 | Rotondaro et al. | |
| 2003/0119291 A1 | 6/2003 | Ahn et al. | |
| 2003/0228747 A1 | 12/2003 | Ahn et al. | |

OTHER PUBLICATIONS

Streetman, "Solid State Electronic Devices," 1990, Prentice-Hall, third edition, p. 350-351.*
Singh, et al, "Comparative Study of Thin Film Transistors using Rare Earth Oxides as gates," Elsevier Sequoia (Netherlands), p. 25-32, ( Feb. 16, 1987).
Osten, et al., "High-k Gate Dielectrics with Ultra-low Leakage Current Based on Praseodymium Oxide," IEDM, IEEE (USA), p. 653-656, ( Oct. 12, 2000).
Singh, et al, "Suitability of Rare Earth Oxides for Use in Thin Film Transistors," Phys. Stat. Sol., 4th ed., p. 885-889, ( Feb. 26, 1987).
Qi, et al., "MOSCAP and MOSFET characteristics using ZrO2 Gate Dielectric deposited directly on Si," IEDM, IEEE (USA), p. 145-148, ( Feb. 26, 1999).
Lee, et al, "Ultrathin Hafnium Oxide with Low Leakage and Excellent Reliability for Alternative Gate Dielectric Application," IEDM, IEEE (USA), p. 133-136, ( Feb. 26, 1999).

* cited by examiner

*Primary Examiner*—Nathan J. Flynn
*Assistant Examiner*—Kevin Quinto
(74) *Attorney, Agent, or Firm*—Hahn Loeser & Parks LLP

(57) ABSTRACT

An electronic component is disclosed having a first layer of metallically conductive material, a second layer of semiconductor material, and a third layer between the first and second layers. The third layer comprises a dielectric and at least inhibits charge carrier transport both from the first to the second layer and also from the second to the first layer. The dielectric comprises praseodymium oxide of the form $Pr_2O_3$ in predominantly single crystal phase, and the second layer comprises silicon with a (001)- or with a (111)-crystal orientation at an interface with the third-layer.

31 Claims, 5 Drawing Sheets

ELECTRONIC COMPONENT HAVING A PRASEODYMIUM OXIDE LAYER AND PROCESS FOR FABRICATING SAME

CROSS-REFERENCE TO RELATED APPLICATIONS

[Not Applicable]

STATEMENT REGARDING FEDERALLY SPONSORED RESEARCH OR DEVELOPMENT

[Not Applicable]

INCORPORATION BY REFERENCE

[Not Applicable]

The invention concerns an electronic component with a first layer of metallically conductive material, a second layer of semiconductor material and a third layer between the first and second layers, wherein the third layer includes a dielectric and is adapted to inhibit or prevent charge carrier transport both from the first to the second layer and also from the second to the first layer.

The invention further concerns a process for the production of an electronic component including a step of depositing a praseodymium oxide-bearing material layer on a substrate.

BACKGROUND OF THE ART

Electronic components of the above-specified kind are usually identified by the abbreviation MIS (metal insulator semiconductor) or, in their most common and most significant configuration, MOS (metal oxide semiconductor). There are known for example MOS diodes, MOS field effect transistors (MOSFET), scaled MOSFETs in which material parameters such as doping are adapted to reduce lateral dimensions of the component structure, modulation-doped MODFETs or DRAM structures.

It should be noted that the metallically conductive first layer of such components can be formed both by metals themselves and also by highly doped (degenerate) semiconductors. In both groups of materials charge transport is effected in the first layer in the electrical field by means of virtually free charge carriers.

It should further be emphasised that the term 'layer' used herein does not necessarily imply a surface extent which is large in comparison with the layer thickness, in (lateral) directions, perpendicularly to the sequence of layers. Subsequent structuring or suitable adjustment of the production parameters, for example in epitaxial production processes, make it possible to produce in electronic components structures whose lateral dimensions are of the order of magnitude of the layer thickness. Such structures are also referred to herein as a 'layer'.

The use of silicon oxide $SiO_2$ as a dielectric in the third layer of electronic components of the kind set forth in the opening part of this specification has encountered physical limits in the recent past. Thus the reduction in the structural dimensions in the case of CMOS (complementary MOS) field effect transistors requires a reduction in the thickness of the gate dielectric between the metallically conductive gate electrode and the doped semiconductor channel. For transistors with channel lengths between the source and the drain of less than 100 nm, when using $SiO_2$ as the gate electrode, by virtue of the relatively low dielectric constant of 3.9, a dielectric layer thickness of less than 2 nm is required. That small layer thickness increases the probability of direct tunnelling of charge carriers and therefore causes markedly increased leakage currents between the gate electrode and the channel or drain, which can adversely affect the efficiency of the transistor.

To resolve the problem, it is known to use alternative materials which can replace silicon oxide as the dielectric. Materials of that kind have a higher dielectric constant than silicon oxide. Thus, having regard to scaling of the component, it is possible to achieve an increase in the gate-oxide capacitance without reducing the layer thickness to a critical range of values in which there is a great probability of direct tunnel processes. As is known the gate-oxide capacitance is proportional to the dielectric constant and anti-proportional to the thickness of the gate dielectric.

Known alternative dielectrics are metal oxides in a predominantly amorphous phase. U.S. Pat. No. 6,013,553, to Wallace, discloses the use of zirconium or hafnium oxynitride as the gate dielectric. U.S. Pat. No. 5,955,213 discloses the use of crystalline $YScMnO_3$ as a gate dielectrode in memory components. U.S. Pat. Nos. 5,810,923 and 5,828,080 disclose the use of an epitaxial $ZrO_2$ layer or $ZrYO_2$ layer as the gate dielectric. Those materials admittedly permit a reduction in the leakage current density in comparison with an $SiO_2$ layer. Here the value of the leakage current density, with the same equivalent oxide layer thickness EOT serves as a comparative measurement. The equivalent oxide layer thickness EOT (Equivalent Oxide Thickness) of a dielectric is the product of the layer thickness d and the ratio of the dielectric constants of silicon oxide ($K_{SiO2}$) and the dielectric ($K_D$):

$$EOT = d \cdot \frac{K_{SiO2}}{K_D} \qquad (1)$$

The values of the leakage current density of $ZrO_2$ and $HfO_2$ with a given value of EOT=1.4 nanometers, which are known from the publications by B H Lee et al, Techn. Dig IEEE International Electron Devices Meeting 1999 (IEDM '99), pages 133 and W J Qi et al, Techn. Dig IEDM '99, pages 145, are admittedly reduced in relation to known values of $SiO_2$ with a gate voltage of 1 V by a factor of up to about $10^{-4}$ to values of between about $10^{-3}$ and $10^{-4}$ A/cm$^2$. However a further reduction in the leakage current density is desirable in order to be able to produce components involving a particularly high degree of scaling, that is to say particularly low dimensions in respect of the relevant component structures.

P Singh, B Baishya, phys stat sol (a) 104, 1987, 885–889 report about investigations into various rare earth oxides, including also predominantly amorphous praseodymium oxide $Pr_6O_{11}$ in terms of the suitability thereof for use as a gate dielectric in thin-film transistors consisting of II–VI semiconductors. The production of such thin-film transistors was effected by means of a 'multiple-pump-down' process by the vaporisation of solid starting materials under the action of an electron beam in a vacuum chamber. The components produced in that way were then subjected to a step of thermal curing in ambient air at 200° C. over between 3 and 4 hours. The components produced in that way, with a praseodymium oxide layer, are of low strength.

The object of the invention is to develop an electronic component of the kind set forth in the opening part of this specification, in such a way that it can be particularly highly scaled. Another object of the invention is to develop a process for the production of an electronic component, including a step of depositing a praseodymium oxide-bearing material layer from a gaseous atmosphere on a substrate, in such a way that particularly highly scaled components can be produced.

SUMMARY OF THE INVENTION

In accordance with the invention, for an electronic component of the kind set forth in the opening part of this specification, that object is attained in that the dielectric contains praseodymium oxide in predominantly crystalline phase. In other words the praseodymium oxide can be present predominantly either in single crystal form or in the form of a plurality of different crystalline phases, but is predominantly not amorphous or polycrystalline.

The invention has the advantage that praseodymium oxide in a predominantly crystalline phase has greatly improved properties in comparison with known dielectrics' suitable for use in scaled electronic components. Such properties include on the one hand the fact that praseodymium oxide layers in accordance with the invention have an effective dielectric constant $K_{eff}$ which is independent of the doping of the substrate, of 31±3. However, depending on other factors, the effective dielectric constant $K_{eff}$ of a dielectric layer according to the invention may range from 20 to 40. On the other hand praseodymium oxide in a predominantly crystalline phase as a dielectric in MOS structures has an extremely low leakage current density. In an MOS structure with an equivalent oxide-layer thickness of 1.4 nm, with a gate voltage of 1 V, values in respect of leakage current density of down to $5*10^{-9}$ A/cm² were measured. By virtue of the identical boundary conditions those values are directly comparable to the above-specified values for $ZrO_2$ and $HfO_2$ and exhibit a reduction in leakage current, density with respect to those dielectrics by a factor of more than $10^{-4}$.

Predominantly crystalline praseodymium oxide layers are further distinguished in that they do not present any significant hysteresis effects in capacitance voltage (CV) measurements. The material is also extremely strong. Without adversely affecting the electrical properties, praseodymium oxide layers deposited on Si can be exposed to a temperature of 1000° C. over a period of 15 seconds. Finally stress induced leakage current measurements (stress induced leakage current, SILC) exhibit a high stress-carrying capacity for praseodymium oxide-bearing dielectric layers even over prolonged periods of time. A breakdown, that is to say a collapse in terms of the dielectric behaviour (dielectric breakdown) occurs only with electrical field strengths above 43 megavolts/cm. After such a breakdown the original dielectric properties are restored again without a significant deviation from previous values.

By virtue of its properties praseodymium oxide is accordingly particularly suitable as a dielectric in a predominantly crystalline phase for scaled electronic components with scaling factors which exceed previous values. It will be appreciated however that it can also be used as a dielectric in other components, for example those referred to in the opening part of this specification.

In a preferred embodiment the third layer of the component according to the invention has a single crystal region. Particularly good dielectric properties of the third, that is to say the gate oxide layer, can be achieved if that layer comprises only a few domains which in themselves are single crystal. The quality of the third layer in contrast falls drastically if the praseodymium oxide is present in a polycrystalline phase. That is shown by virtue of greatly increased values of the leakage current density.

In a further embodiment the third layer has an amorphous region. That is typically arranged in the region of the interface between the second and third layers and extends in the lateral direction over the entire interface. For example in CMOS field effect transistors in which the second layer quite predominantly comprises silicon, the amorphous region, according to previous investigations, contains a praseodymium silicate.

Suitable adjustment of the parameters of the production process make it possible to prevent the occurrence of such an amorphous intermediate layer. The extent of the amorphous region should at any event in the direction of the sequence of layers be a maximum of 20% of the overall extent of the third layer in that direction. The previous investigations brought to light signs that an amorphous intermediate layer has a lower dielectric constant than the crystalline phase. The thickness ratios of the amorphous intermediate layer and the crystalline layer however determine the resulting effective dielectric constant of the third layer as a whole.

In further embodiments of the electronic component according to the invention the extent of the third layer in the direction of the sequence of layers is a maximum of 50 nanometers.

Adding other materials to the third layer such as for example $ZrO_2$ or $HfO_2$ is basically readily possible. Preferably however the dielectric completely consists of praseodymium oxide.

Basically all known oxides of praseodymium, that is to say for example $PrO_2$, both modifications of $Pr_2O_3$ or $Pr_6O_{11}$ can be contained in the dielectric. In a preferred embodiment the dielectric contains praseodymium oxide $Pr_2O_3$. In previous investigations the best results were achieved with that oxide of praseodymium.

In this respect $Pr_2O_3$ is preferably present in a $D5_3$-crystal structure or a $D5_2$-crystal structure. The $D5_3$-structure occurs for example under suitable growth parameters when depositing $Pr_2O_3$ on an Si(001)-surface. When depositing $Pr_2O_3$ on an Si-(111) surface a $D5_2$-structure occurs with suitable growth parameters.

The electronic component which is by far preferred at the present time for carrying out the invention is a field effect transistor. In an embodiment the electronic component is in the form of a scaled CMOS-FET, wherein the first layer is in the form of a gate electrode and the third layer adjoins a channel which is formed in the second layer, in a direction perpendicular to the sequence of layers, between a source structure and a drain structure. In a further embodiment the electronic component according to the invention is in the form of a modulation-doped field effect transistor (MODFET).

At its interface to the third layer the second layer preferably entirely predominantly consists of silicon with a (001)- or a (111)-crystal orientation.

In regard to its process aspect the invention provides a development in a process for the production of an electronic component including a step of depositing a praseodymium oxide-bearing material layer from a gaseous atmosphere on a substrate, in that the praseodymium oxide-bearing material layer is deposited at a substrate temperature of between 500° C. and 800° C.

The advantage of the process according to the invention is that the praseodymium-bearing material layer is deposited in the specified substrate temperature range in predominantly crystalline form. The occurrence of a polycrystalline praseodymium-bearing material layer is prevented. That results in the production predominantly of crystalline praseodymium-bearing layers which, as has been demonstrated hereinbefore and as will be described in detail hereinafter with reference to FIGS. 1 through 8, have extremely advantageous dielectric properties.

The substrate for the growth of the praseodymium-bearing material layer is formed by the layer previously grown or prepared in the production process. In the production of a CMOS-FET for example the channel layer forms the substrate for deposit of the gate dielectric. The channel layer is usually formed by single crystal silicon in a (001)-orientation.

In a preferred form of the process praseodymium oxide-bearing material layers are deposited in a substrate temperature range of between 600° C. and 700° C. The layers produced under those conditions have a particularly pure crystal structure. In that respect the best results are attained at the present time with a substrate temperature of 625° C.

The step of depositing a praseodymium-bearing material layer can be executed by means of a per se known molecular beam-epitaxial growth process.

In an embodiment of the process according to the invention preferably a solid starting material is vaporised for deposit of the praseodymium-bearing material layer. A part of the vaporised material passes into the area immediately around the substrate on which crystal formation then gradually occurs. Vaporisation can be effected for example under the action of an electron beam. For example all known praseodymium oxides can be used as the solid starting material. Preferably praseodymium oxide $Pr_6O_{11}$ is used.

Alternatively, for the deposit of praseodymium oxide on the substrate, it is possible to perform a chemical reaction of two or more gaseous starting substances. It is possible for that purpose to have recourse to known processes of gaseous phase epitaxy. For example a chemical reaction of two or more metallo-organic gaseous starting substances is effected for the deposit of praseodymium oxide on the substrate. It is possible for that purpose to use common MOCVD (metal organic chemical vapor deposition) or MOVPE (metal organic chemical vapor epitaxy) reactors and processes.

Single crystal layers or layers composed of various crystalline phases can be grown by means of the specified growth processes. The crystalline orientation of the praseodymium-bearing layer with respect to the channel can be epitaxial in that respect.

The purity of the crystal structure in an embodiment of the process of the invention is improved by a thermal curing step which follows the deposition step. During the thermal curing operation the substrate temperature is at least 400° C. and at most 1000° C., in particular between 550° C. and 700° C. Layers which are cured at 600° C. over a short period of time (about 5 minutes) exhibit no hysteresis in respect of capacitance in capacitance-voltage (CV) measurements. The degree of surface roughness is on average (RMS) less than 0.5 nm.

BRIEF DESCRIPTION OF THE DRAWINGS

Further advantages of the invention are described in the description hereinafter of some embodiments by way of example with reference to the drawings in which.

DETAILED DESCRIPTION OF THE INVENTION

Figure 1:
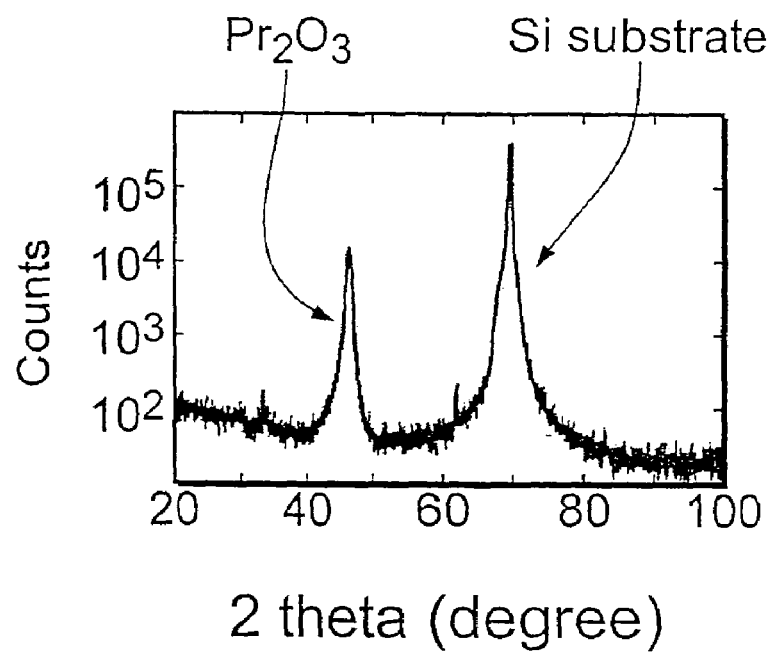
FIG. 1 shows an X-ray diffraction spectrum of a $Pr_2O_3$ layer on Si (001)

FIG. 1 shows an X-ray diffraction spectrum of a 13.4 nanometer thick $Pr_2O_3$ layer on (001) silicon. That layer was produced at a substrate temperature of 625° C. by means of molecular beam epitaxy using solid starting material ($Pr_6O_{11}$) and then thermally cured at a substrate temperature of 600° C. for five minutes. The Figure shows the diffracted X-ray intensity in units of counting pulses of a detector as a function of double the diffraction angle (2 theta). The spectrum shows a dominant diffraction line at 2 theta=70° which is to be attributed to diffraction at the silicon lattice. At a double diffraction angle of about 45° there is a second diffraction line with in comparison a somewhat lesser degree of intensity than that of the silicon peak. That line is to be attributed to diffraction of the X-ray light at the crystal lattice of $Pr_2O_3$. This result shows that the praseodymium oxide is predominantly present in single crystal form and is confirmed moreover by electron diffraction and high-resolution transmission electron microscope investigations (not shown here).

Figure 2:
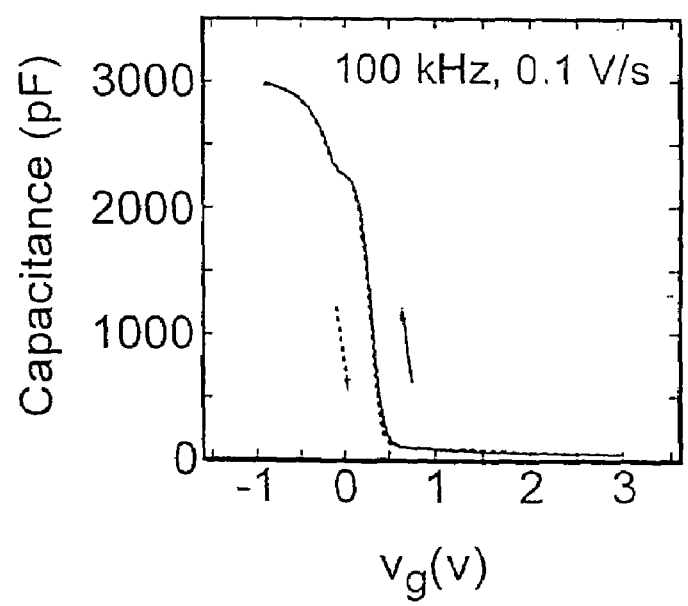
FIG. 2 shows the result of a CV measurement on a second $Pr_2O_3$ layer grown on p-Si.

FIG. 2 shows the result of a capacitance-voltage (CV) measurement on a second, 13.4 nm thick $Pr_2O_3$ layer. Shown here is the dependency of the capacitance on the maximum amplitude of a high-frequency (100 kHz) voltage pulse $V_g$ between an electrode which is described in greater detail hereinafter and the substrate, wherein the maximum amplitude of the high-frequency voltage pulse was increased and reduced respectively by 0.1 volt per second for recording the two illustrated curves. The present layer was deposited on p-doped (001)-silicon with a specific resistance of 10 ohms* centimeter under otherwise identical conditions to the layer shown in FIG. 1 and then provided with a gold electrode. The gold electrode was applied by the deposition of vaporised gold through a shadow mask. The measurement was effected after thermal curing. In the graph shown in FIG. 2 a solid line shows the CV curve with a first measuring run during which the maximum amplitude of the voltage pulse was reduced from 3 volts to −1 volt. A broken line in the graph shows the CV curve in the case of an immediately following second measuring run during which the maximum amplitude of the voltage pulse was increased from −1 volt to 3 volts. The capacitance of the layer is approximately 3000 picofarads with a voltage of −1 volt and it drastically falls from a voltage value of about −0.5 volt to values of around 200 picofarads at +0.5 volt. With a further increase in voltage the value of the capacitance falls slightly to a value of below 100 picofarads at 3 volts. The measurements are very substantially independent of the direction of the measuring run and show that no significant hysteresis effects occur.

Figure 3:
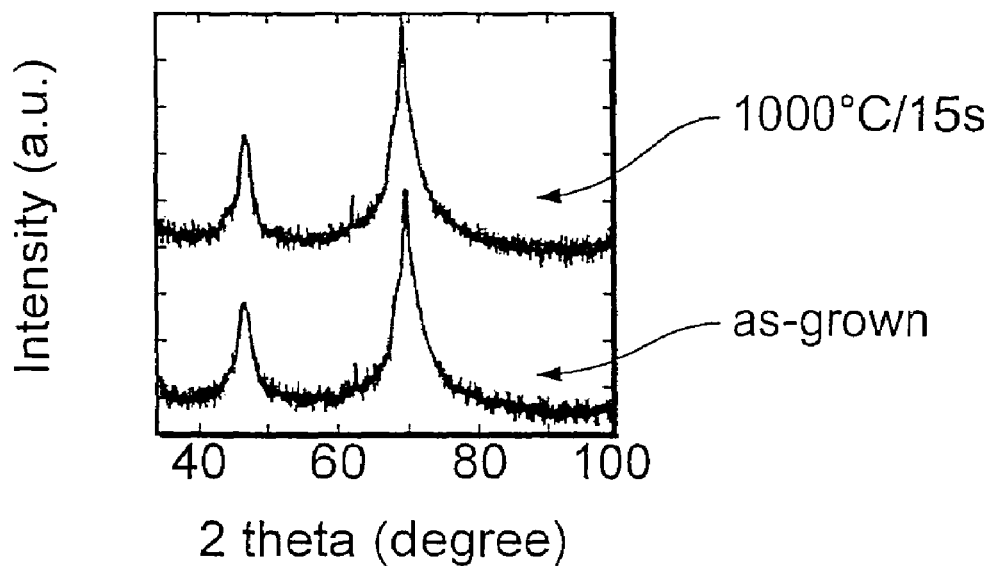
FIG. 3 shows a comparison of the X-ray diffraction spectra of a third $Pr_2O_3$ layer in the untreated condition and after short-term heating at 1000° C.

FIG. 3 shows two X-ray spectra of the same kind as FIG. 1. They were measured on a third, 14.9 nm thick $Pr_2O_3$ layer on silicon, more specifically on the one hand (lower spectrum) in the untreated condition ('as grown') and on the other hand (upper spectrum) subsequently to a thermal treatment in a nitrogen atmosphere at a substrate temperature of 1000° C. over a period of time of 15 seconds. The X-ray spectrum of the treated layer is displaced upwardly in the direction of the ordinate solely to make the illustration clearer. It is shown in a comparison of the two spectra that the thermal treatment had no measurable influence on the crystalline structure of the treated sample. For, the two spectra are substantially identical. A worsening of the purity of the crystal structure would have been apparent on the basis of a widening of the peak to be associated with the $Pr_2O_3$, at about 2 theta=45°.

Figure 4:
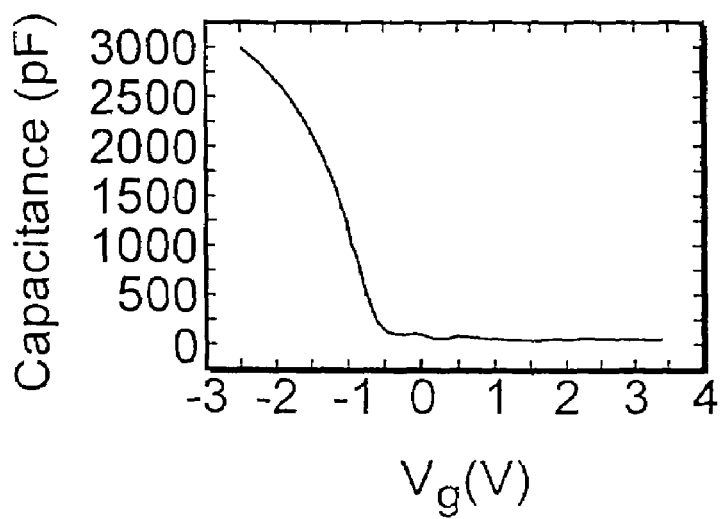
FIG. 4 shows the result of a CV measurement at the third layer after the heating operation.

FIG. 4 shows the result of a CV measurement carried out in a similar manner to the procedure described with reference to FIG. 2, on the thermally treated third layer. The dependency of capacitance on voltage is scarcely altered in the case of the treated layer in comparison with the dependency known from FIG. 2 in respect of the comparable but untreated second layer. This shows that the dielectric properties of the sample after a thermal treatment even at very high temperatures such as 1000° C. do not experience any worsening.

Figure 5:
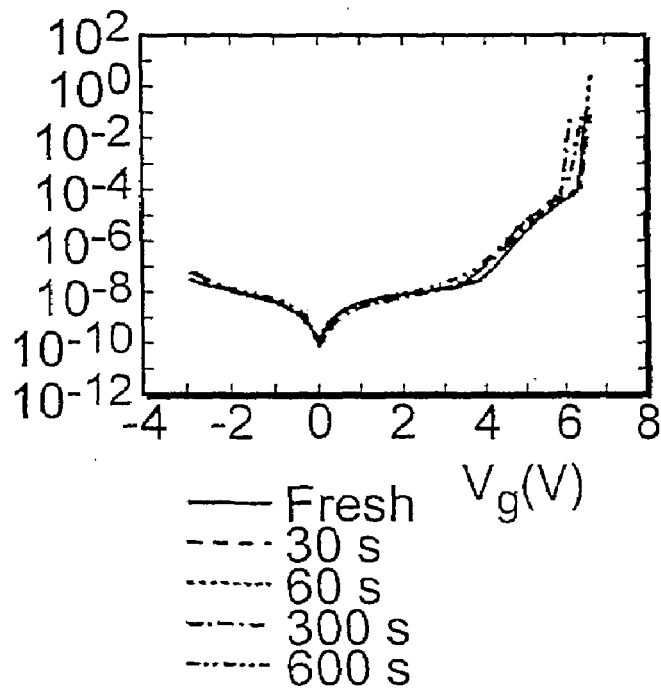
FIG. 5 shows the result of SILC measurements at a fourth $Pr_2O_3$ layer.

FIG. 5 shows the result of SILC measurements on a fourth $Pr_2O_3$ layer on a silicon substrate. That layer has an EOT of 1.4 nm and is provided with a gold electrode. Immediately prior to measurement it was exposed to a voltage of 4.56 volts, corresponding to 32 megavolts/centimeter. The Figure illustrates the magnitude of the leakage current density $J_g$ in units of ampere/cm$^2$ in dependence on the voltage $V_g$ between the gold electrode and the substrate. Five measurement operations were carried out, which were preceded by stress times on the sample, of differing lengths. The results are shown in the graph in FIG. 5 by means of curves involving different kinds of lines. The first measurement (solid line) was carried out before the layer was exposed to the stressing voltage. Further measurements were carried out after stressing times lasting for 30, 60, 300 and 600 seconds. The attributions of the measurement curves with the respective measurement procedure can be seen from the legend in the diagram at top left. Accordingly there are extremely slight changes in the dependency of the leakage current density on the gate voltage $V_g$ even after the layer is stressed over a period of 600 seconds. That confirms the surprisingly high stressability, which had already been previously established, of the layers produced in accordance with the process of the invention.

Figure 6:
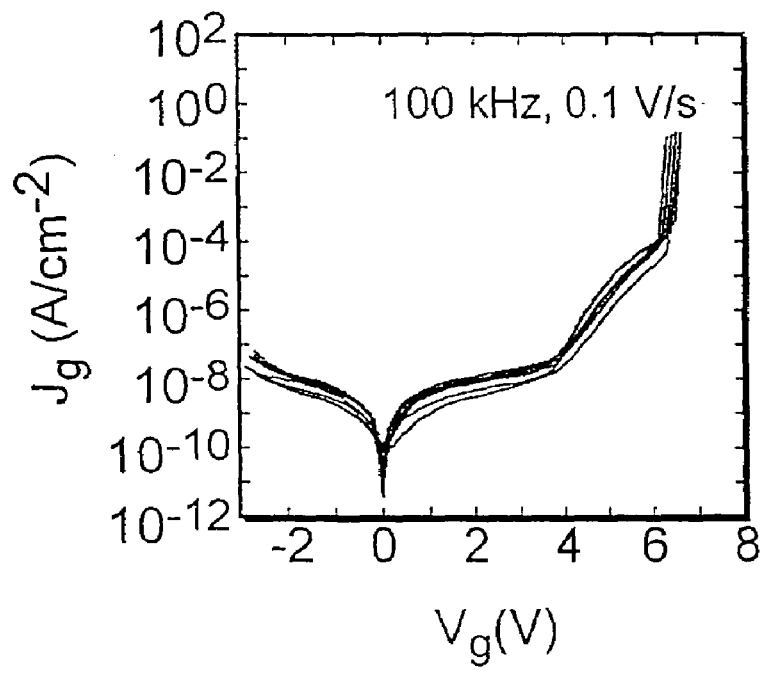
FIG. 6 shows the result of measurements of current density in dependence on the applied voltage at 16 similarly produced gold/$Pr_2O_3$/n-Si capacitors.

FIG. 6 shows the result of measurements of the leakage current density $J_g$ in dependence on the applied voltage $V_g$ at 16 similarly produced gold/$Pr_2O_3$/n-Si capacitors. The substrate area covered by the praseodymium oxide layer was $1.89*10^{-3}$ cm$^2$ in the case of all capacitors. The EOT was 1.4 nm. All the curves illustrated show a similar configuration. The leakage current density, with a voltage of $V_g=-2$ volts, is between $10^{-8}$ and $10^{-7}$ A/cm$^2$, then falls to a value of below $10^{-11}$ A/cm$^2$ at 0 volt and rises with an increasing positive voltage $V_g$ approximately symmetrically with respect to the configuration with negative voltage values. At $V_g=1$ volt the leakage current density on average reaches a value of $J_g$ (1 V)=(5.0±0.5)*10$^{-9}$ A/cm$^2$. The fluctuation in that value with different capacitors is evidently extremely slight. Towards higher positive voltages the leakage current density further rises. A breakdown occurs only above 6 volts, corresponding to an electrical field strength of 43 megavolt/cm.

Figure 7:
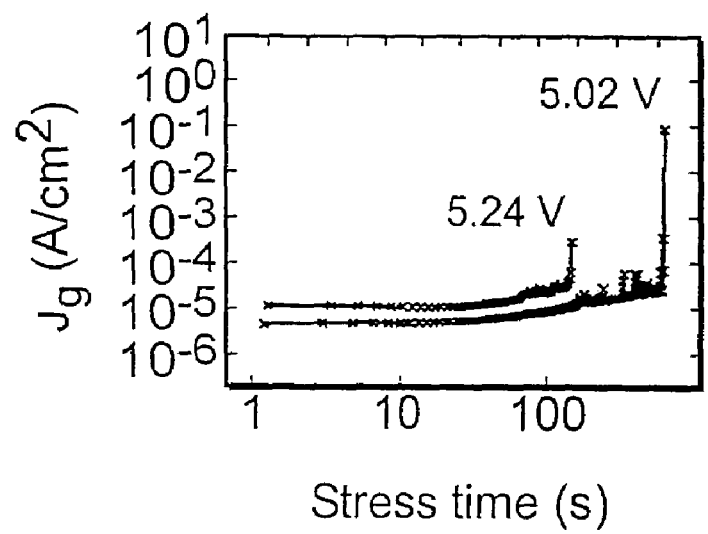
FIG. 7 shows the result of measurements of current density as a function of time at two further gold/$Pr_2O_3$/n-Si capacitors under two different electrical voltages.

FIG. 7 shows as a result of a further stress measurement the dependency of the leakage current density on the moment in time after application of a voltage of 5.02 V and 5.24 V respectively for two gold/$Pr_2O_3$/Si (001) capacitors with an EOT of 1.4 nm. A breakdown is to be observed only after over 100 s. These measurements also show the strength of the layers produced with the process according to the invention.

Figure 8:
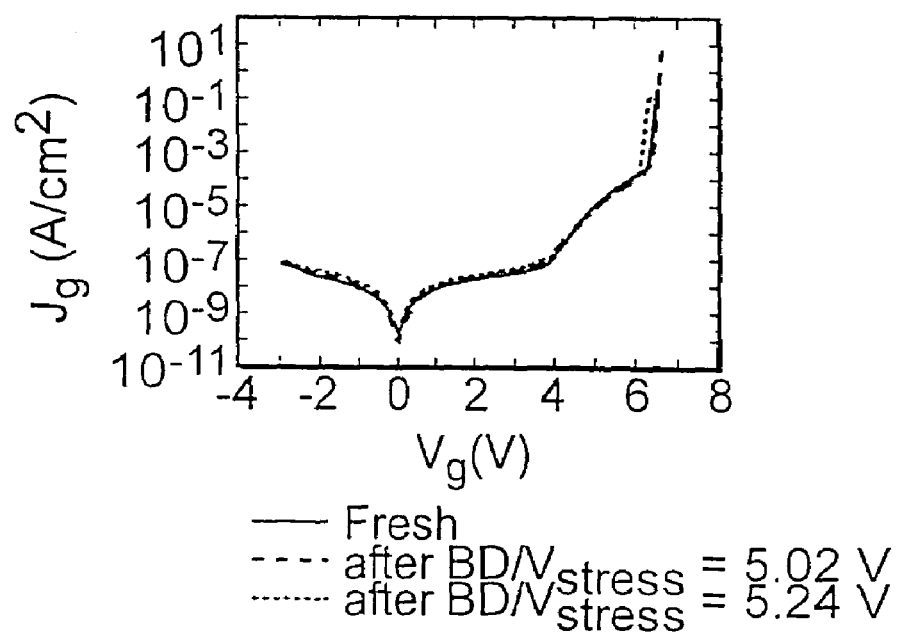
FIG. 8 shows the result of measurements of current density in dependence on the applied voltage with the same capacitors as in FIG. 7 after carrying out the measurements in FIG. 7.

FIG. 8 shows the results of CV measurements at the two capacitors prior to and after the stress measurements shown in FIG. 7. The curves illustrated in broken line reproduce the dependency after stress measurement (see the legend at top left in the graph) while the curve in solid line represents the dependency prior to measurement. It can be seen that the breakdown produced in the stress measurements causes only extremely slight differences in the dependency of the leakage current density $J_g$ on the gate voltage $V_g$. The capacitors therefore completely 'recover' from the breakdown.

Figure 9:
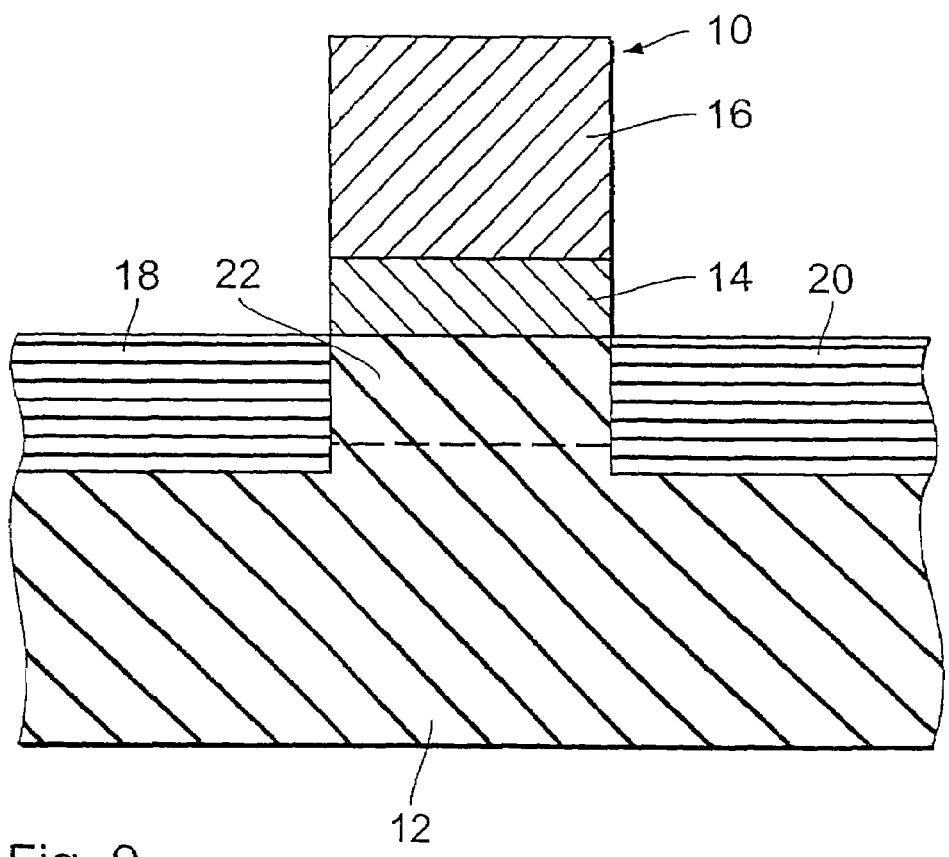
FIG. 9 is a diagrammatic view of the layer structure in the region of the gate of an MOSFET.

FIG. 9 shows a diagrammatic view in section of an MOSFET 10 according to the invention. A gate oxide layer 14 is grown on a silicon substrate 12 with (001) orientation. The gate oxide layer 14 comprises praseodymium oxide $Pr_2O_3$. The thickness thereof is less than 50 nm. A gate electrode 16 is applied on the gate oxide layer 14. The gate electrode 16 in the present embodiment comprises gold but it can also comprise p- or n-conducting silicon, another metal, or an alloy of a plurality of metals, in each case individually or in combination with each other.

The substrate has a source portion 18 doped by means for example of iron implantation and a drain portion 20. A doped channel 22 extends perpendicularly to the sequence of layers between the source 18 and the drain 20.

The structure of the MOSFET 10 illustrated here is basically known. The illustration therefore does not include details with which the man skilled in the art is in any case familiar. However, by means of the gate oxide layer, new options in regard to the scaling of such MOSFETs are afforded, which in detail can result in changes to the structure. It will be appreciated that the direction of the sequence of layers of the MOSFET 10 can be varied as desired.

Figure 10:
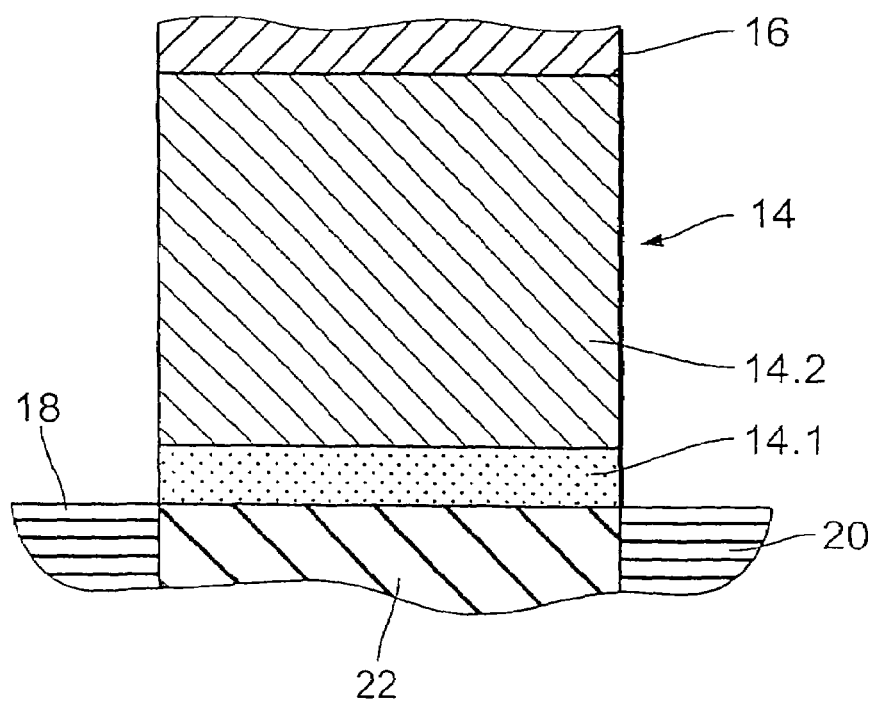
FIG. 10 is a diagrammatic view of an Si-based CMOS-FET according to the invention.

FIG. 10 is a view on an enlarged scale showing the region of the gate oxide 14 from FIG. 1. The same references denote the same structural elements of the MOSFET 10, in comparison with FIG. 1. The gate oxide layer 14 has an amorphous interface layer 14.1 which directly adjoins the channel 14 and which includes a silicate with praseodymium and oxygen. By suitable choice of the growth parameters in the production of the gate oxide layer the thickness of the interface layer 14.1 in the direction of the sequence of layers is less than 20% of the thickness of the gate oxide layer 14. Towards the gate electrode 16 the interface layer 14.1 is adjoined by a predominantly single crystal praseodymium oxide layer 14.2.

The invention claimed is:
1. An electronic component, comprising:
a first layer of metallically conductive material;
a second layer of semiconductor material; and
a third layer between the first and second layers, wherein the third layer comprises a dielectric and at least inhibits charge carrier transport both from the first to the second layer and also from the second to the first layer, and wherein the dielectric comprises praseodymium oxide of the form $Pr_2O_3$ in predominantly single crystal phase, and wherein the second layer comprises silicon with a (001)- or with a (111)-crystal orientation at an interface with the third-layer.

2. The electronic component of claim 1, wherein the third layer extends a maximum of 50 nanometers in a direction of the sequence of the layers.

3. The electronic component of claim 1, wherein the dielectric consists solely of praseodymium oxide.

4. The electronic component of claim 1, wherein the dielectric has a dielectric constant that is between 20 and 40.

5. The electronic component of claim 1, wherein the $Pr_2O_3$ is in at least one of a $D5_3$-crystal structure or a $D5_2$-crystal structure.

6. The electronic component of claim 1, wherein the component comprises a field effect transistor.

7. The electronic component of claim 1, wherein the component comprises a scaled CMOS-FET, wherein the first layer is a gate electrode and the third layer adjoins a channel provided in the second layer in a direction perpendicular to the sequence of layers between a source structure and a drain structure.

8. The electronic component of claim 1, wherein the third layer has an amorphous region.

9. The electronic component of claim 8, wherein the amorphous region extends a maximum of 20% of a thickness of the third layer in a direction of the sequence of the layers.

10. A process for producing an electronic component, comprising the step of:

depositing a praseodymium oxide-bearing material layer from a gaseous atmosphere on a substrate at a substrate temperature of between 500° C. and 800° C.

11. The process of claim 10, wherein the depositing step is conducted by means of a molecular beam-epitaxial growth process.

12. The process of claim 10, wherein the depositing step is preceded by the step of vaporizing a solid starting material to provide the gaseous atmosphere.

13. The process of claim 12, wherein the solid starting material is praseodymium oxide $Pr_6O_{11}$.

14. The process of claim 10, wherein the gaseous atmosphere is provided by chemically reacting at least two gaseous starting substances.

15. The process of claim 14, wherein the at least two gaseous starting substances are metallo-organic compounds.

16. The process of claim 10, wherein the depositing step is followed by curing thermally, at a substrate temperature in the range of from 400° C. to 1000° C.

17. The process of claim 16, wherein the thermal curing step is conducted at a substrate temperature in the range of between 550° C. and 700° C.

18. The process of claim 10, wherein the depositing step is conducted at a substrate temperature of between 600° C. and 750° C.

19. The process of claim 18, wherein the depositing step is conducted at a substrate temperature of 625° C.

20. The process of claim 19, wherein the depositing step is conducted by means of a molecular beam-epitaxial growth process.

21. The process of claim 19, wherein the depositing step is preceded by the step of vaporizing a solid starting material to provide the gaseous atmosphere.

22. The process of claim 21, wherein the solid starting material is praseodymium oxide $Pr_6O_{11}$.

23. The process of claim 19, wherein the gaseous atmosphere is provided by chemically reacting at least two gaseous starting substances.

24. The process of claim 23, wherein the at least two gaseous starting substances are metallo-organic compounds.

25. The process of claim 19, wherein the depositing step is followed by curing thermally, at a substrate temperature in the range of from 400° C. to 1000° C.

26. The process of claim 25, wherein the thermal curing step is conducted at a substrate temperature in the range of between 550° C. and 700° C.

27. An electronic component, comprising:

a first layer of metallically conductive material;

a second layer of semiconductor material; and a third layer between the first and second layers, wherein the third layer comprises a dielectric and at least inhibits charge carrier transport both from the first to the second layer and also from the second to the first layer, and wherein the dielectric comprises praseodymium oxide of the form $Pr_2O_3$ in predominantly single crystal phase, and wherein the third layer has an amorphous region, and wherein the second layer comprises silicon with a (001)- or with a (111)-crystal orientation at an interface with the third-layer.

28. The electronic component of claim 27, wherein the amorphous region extends a maximum of 20% of a thickness of the third layer in a direction of the sequence of the layers.

29. An electronic component, comprising:

a first layer of metallically conductive material;

a second layer of semiconductor material; and a third layer between the first and second layers, wherein the third layer comprises a dielectric and at least inhibits charge carrier transport both from the first to the second layer and also from the second to the first layer, and wherein the dielectric comprises praseodymium oxide of the form $Pr_2O_3$ in predominantly single crystal phase of at least one of a $D5_3$-crystal structure or a $D5_2$-crystal structure, and wherein the second layer comprises silicon with a (001)- or with a (111)-crystal orientation at an interface with the third-layer.

30. An electronic component, comprising:

a first layer of metallically conductive material;

a second layer of semiconductor material; and a third layer between the first and second layers, said layers forming a field effect transistor, and wherein the third layer comprises a dielectric and at least inhibits charge carrier transport both from the first to the second layer and also from the second to the first layer, and wherein the dielectric comprises praseodymium oxide of the form $Pr_2O_3$ in predominantly single crystal phase, and wherein the second layer comprises silicon with a (001)- or with a (111)-crystal orientation at an interface with the third-layer.

31. An electronic component, comprising:

a first layer of metallically conductive material forming a gate electrode;

a second layer of semiconductor material; and a third layer between the first and second layers, said layers forming a scaled CMOS-FET, and wherein the third layer comprises a dielectric and at least inhibits charge carrier transport both from the first to the second layer and also from the second to the first layer, and wherein the dielectric comprises praseodymium oxide of the form $Pr_2O_3$ in predominantly single crystal phase, and wherein the second layer comprises silicon with a (001)- or with a (111)-crystal orientation at an interface with the third-layer, and wherein the third layer adjoins a channel provided in the second layer in a direction perpendicular to the sequence of layers between a source structure and a drain structure.

* * * * *